United States Patent [19]

Grosjean et al.

[11] 3,998,369
[45] Dec. 21, 1976

[54] DEVICE FOR ACCURATELY POSITIONING A FLEXIBLE STRIP WITH RESPECT TO AN IMAGE

[75] Inventors: Henri Grosjean, le Plessis Trevise; Jean Lassechere, Paris; Pierre Louis Sigel, Villeneuve-le-Roi, all of France

[73] Assignee: Compagnie Honeywell Bull, Paris, France

[22] Filed: May 1, 1975

[21] Appl. No.: 573,470

[30] Foreign Application Priority Data

May 8, 1974 France .............................. 74.15944

[52] U.S. Cl. .................................... 226/58; 226/87
[51] Int. Cl.² .......................................... G03B 1/28
[58] Field of Search ................. 226/55, 57, 58, 87, 226/196

[56] References Cited

UNITED STATES PATENTS

| 3,900,257 | 8/1975 | Woolley ........................... 226/57 X |
| 3,914,035 | 8/1975 | Satterfield ....................... 226/55 X |

*Primary Examiner*—Richard A. Schacher
*Attorney, Agent, or Firm*—Cameron, Kerkam, Sutton, Stowell & Stowell

[57] ABSTRACT

An apparatus for accurately positioning a flexible strip, having lateral perforations, with respect to an image. The apparatus includes two supports, a stud member attached to the movable support and an intercepting arm attached to the fixed support. The stud member includes a working section for engagement of the lateral perforation and alignment of the strip and a biased sleeve for position maintenance of the strip. The intercepting arm stays action of the sleeve until alignment is substantially achieved.

13 Claims, 7 Drawing Figures

DEVICE FOR ACCURATELY POSITIONING A FLEXIBLE STRIP WITH RESPECT TO AN IMAGE

BACKGROUND OF THE INVENTION

The present invention relates to an arrangement for accurately positioning a flat image and a flexible strip provided with lateral perforations.

Such an arrangement is particularly, although not exclusively, applicable to photo-etching apparatus and to apparatus for reproducing images by photographic means.

In the known art of producing integrated circuits, a wafer cut from a mono-crystal of a semiconductor material, such as silicon, is subjected to a series of operations involving doping, masking, photochemical etching and the ionic diffusion or implantation of doping materials, so as to form within the wafer a plurality of identical, regularly distributed integrated circuits. The wafer is then cut up into micro-wafers, which are generally referred to as "chips", each chip containing one basic set of integrated circuits. Each chip is provided with contact areas which are arranged in a predetermined configuration and, by means of interface conductors which are soldered to these areas, are intended to provide the electrical connection between each chip and a wiring support such as a printed circuit board.

In order to make the chips, which are of very small dimensions, easier to handle and to make them easier to mount on a wiring support, it has been proposed that the chips be attached to a flexible strip of an inextensible insulating material which, so that it can be moved along, is provided with regularly spaced lateral perforations. The strip is also provided with equidistant windows or openings to hold the chips in each of which openings terminate the free inner ends of radiating interface conductors, these ends being so arranged as to match the configuration of the contact areas on the chips. The chips are mounted on the strip by placing each of them under a respective one of the openings in the strip so that the contact areas on the chip each line up with a respective one of the inner ends of the interface conductors associated with this opening, and by then soldering the ends to the said contact areas.

Chips which have been mounted on the strip in this way may then be attached to a wiring support, such as a printed circuit board, by using a machine of the same type as that which is, inter alia, described in U.S. patent application Ser. No. 369,234 which was filed by the present Applicant on June 12, 1973. In this machine, the strip is fed forward step-by-step so as to bring each of the chips to the centre of a cutting die. The machine incorporates a soldering tool whose heating bit is adapted to engage in the die and, in the course of so engaging, to cut through the interface conductors very close to the edges of the chip. Having been detached from the strip in this way, the chip in then carried along by the soldering tool to be applied to the wiring support and soldered to it.

Given that in this machine the lateral perforations in the strip are used not only to move it along step-by-step but also to locate the chip accurately in relation to the cutting die and the soldering tool, it is important that the chips, and thus the radiating interface conductors should be very accurately positioned in relation to the lateral perforations.

The radiating interface conductors on the strip are preferably produced in the form of flat conductors which are obtained by photo-etching a thin sheet or foil conductive material which is attached to one of the faces of the strip. To this end, the foil, having been laminated to the said face of the strip, is covered with a layer of photo-sensitive lacquer. This layer is then exposed photo-graphically by a light source through a mask or transparency which bears a design corresponding to the configuration of the conductors which are to be formed. After this, the photo-sensitive lacquer is developed and the areas of the lacquer which have been exposed are removed so as to allow the areas of metal which are uncovered to be etched.

To expose the photo-sensitive lacquer through the mask which bears the design to be reproduced, apparatus has been proposed in which the metallised strip, after having been coated with its layer of lacquer, is moved along continuously, and an endless belt carrying the design to be reproduced is moved at the same speed as the strip so as to be superposed on the photo-sensitive lacquer for a predetermined distance, exposure taking place for a predetermined length of time while the endless belt and the layer of lacquer are superimposed. In this apparatus, the strip and the endless belt are, when superimposed, held in contact with one another by being gripped between toothed pinions and elastic pressure rollers. Such an arrangement prevents the strip and the belt from slipping on one another during exposure but it makes it necessary to provide lateral perforations in the endless belt which need to match exactly those in the strip. Furthermore, where the radiating conductors to be produced are of the same configuration for the whole length of the strip, it is necessary for the endless belt to be provided with designs which are absolutely identical to one another, which designs also need to be correctly positioned in relation to the perforations in the belt. The result is that not only is it a particularly costly matter to produce such an endless belt, because of the very close tolerances which must be observed, but also when the belt is driven by means of toothed pinions it is not possible to ensure that the belt and the strip are superimposed with extreme accuracy, since it is possible that the mis-alignment between perforations in the strip and the perforations in the belt which is superimposed on it may be as much as two-tenths of millimeter. The same error may then be repeated in the position of the radiating interface conductors which are produced in each of the openings in the strip, relative to the perforations in the strip. Furthermore, when it is necessary to change the endless belt in order to form on the strip radiating interface conductors whose configuration differs from that of the interface conductors formed previously, it proves a particularly awkward operation to remove the belt being used and replace it with another belt, because of the risks of damage to the perforations when they are disengaged from, or engaged onto, the teeth of the pinions.

The present invention overcomes these drawbacks and proposes a positioning arrangement which allows a flat image, such as a mask or a transparency, to be positioned with very great accuracy on a flexible, laterally perforated strip. This arrangement proves even more advantageous in that it provides very easy access to the flat image and, when used in exposing equipment designed to form radiating interface conductors on a flexible strip intended to carry chips, it makes it possible to produce on the strip a series of absolutely identical images which are perfectly positioned in relation to the lateral perforations in the strip.

SUMMARY OF THE INVENTION

The invention relates to an arrangement for accurately positioning a flat image and a flexible strip provided with lateral perforations, this arrangement consisting of a first support which is provided with a sliding surface for the said strip, and a second support which includes means for holding the said image, this second support being adapted to move between a first position in which it is at its furthest from the first support and a second position in which the image is pressed against the strip, the said arrangement being characterised in that it further includes, a peg attached to the second support, the cross-section of the working portion of which corresponds in shape to the said perforations so that it is able to fit closely into one of the perforations in the strip when the second support moves towards its second position, a sleeve which is adapted to slide on this peg and which is urged by a return means so as normally to mask the working portion of the said peg, and intercepting means which are designed, on the one hand, to intercept the said sleeve when the second support moves from its first to its second position and, on the other hand, to release the sleeve as soon as the said peg has fitted closely into a perforation in the strip, thus allowing the said sleeve to press against the strip under the action of a return means.

Other features and advantages of the invention will become apparent from the following description.

BRIEF DESCRIPTION OF THE DRAWINGS

A perferred embodiment of the present invention will be described, in detail, with reference to the accompanying drawings, which show.

DESCRIPTION OF THE PREFERRED EMBODIMENT

Figure 1:
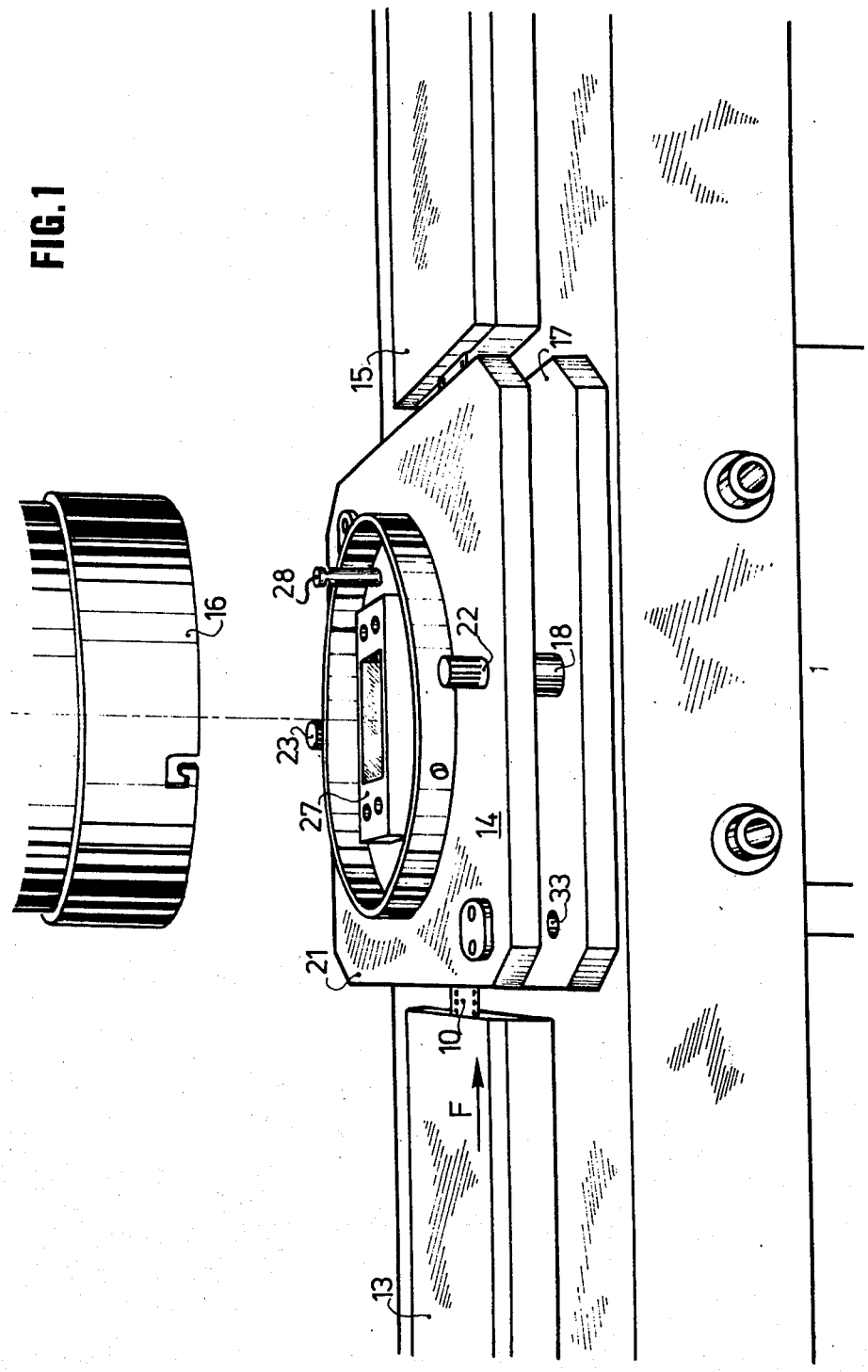
FIG. 1, a perspective view of part of an exposure apparatus which is fitted with a positioning arrangement designed in accordance with the invention.
Figure 2:
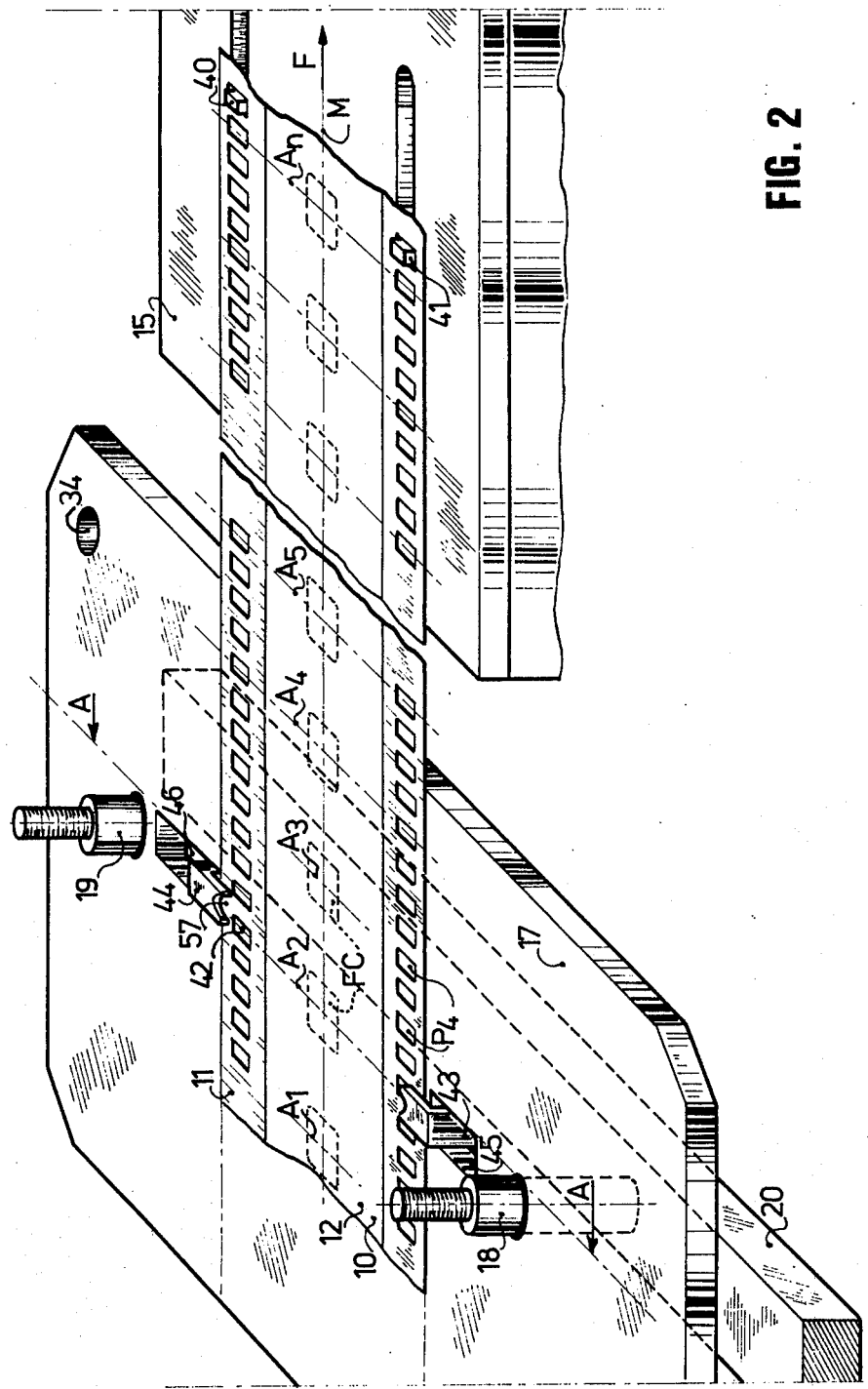
FIG. 2, a schematic perspective view showing the position of the strip on the second support of the positioning arrangement used in the apparatus shown in FIG. 1

FIG. 1 shows part of an exposure apparatus which is intended to form, on a metallised strip 10 which has previously been coated with a layer of photosensitive lacquer, a series of patterns, the configuration of which corresponds to that of radiating interface conductors which are to be produced on this strip to allow integrated circuit chips to be affixed to it. Referring to FIG. 2, it can be seen that strip 10 is formed from an insulating band 11 of a flexible but inextensible material such as the synthetic polyimide resin which is known commercially by the name "Kapton" (trade mark). The band is provided, on the one hand, with regularly spaced lateral perforations PL and, on the other hand, with equidistant central openings or windows FC, each of which is intended to allow one integrated circuit chip to be mounted in it. This band 11 is covered with a very thin foil or ribbon of metal 12 which is attached to the upper face of the insulating band 11 in the central part of the latter, the width of the ribbon of metal 12 being less than that of the insulating band 11. It will be assumed that, before strip 10 is fed into the exposure apparatus, the ribbon of metal has been coated in a known way with a layer of photo-sensitive lacquer of uniform depth. Returning now to FIG. 1, it can be seen that strip 10, which is moved step-by-step through the exposure apparatus in the direction indicated by arrow F, first passes through a guide passage 13 before reaching an exposure position where there is a positioning arrangement 14 which will be described below. The step-by-step advance of the strip is brought about by a feed device 15 which may be, for example, of the type which is described and illustrated in U.S. Pat. No. 3,825,161. As it passes through the positioning arrangement, the layer of photo-sensitive lacquer is exposed to the action of radiation emitted by a light source (not shown) which is located above the positioning arrangement. A shielding tube 16, only the lower part of which is seen in FIG. 1, seals in the light from this source and the time for which the lacquer is exposed may be adjusted in a known way by means of a shutter, which is not shown in the drawings since it forms no part of the invention.

Figure 3:
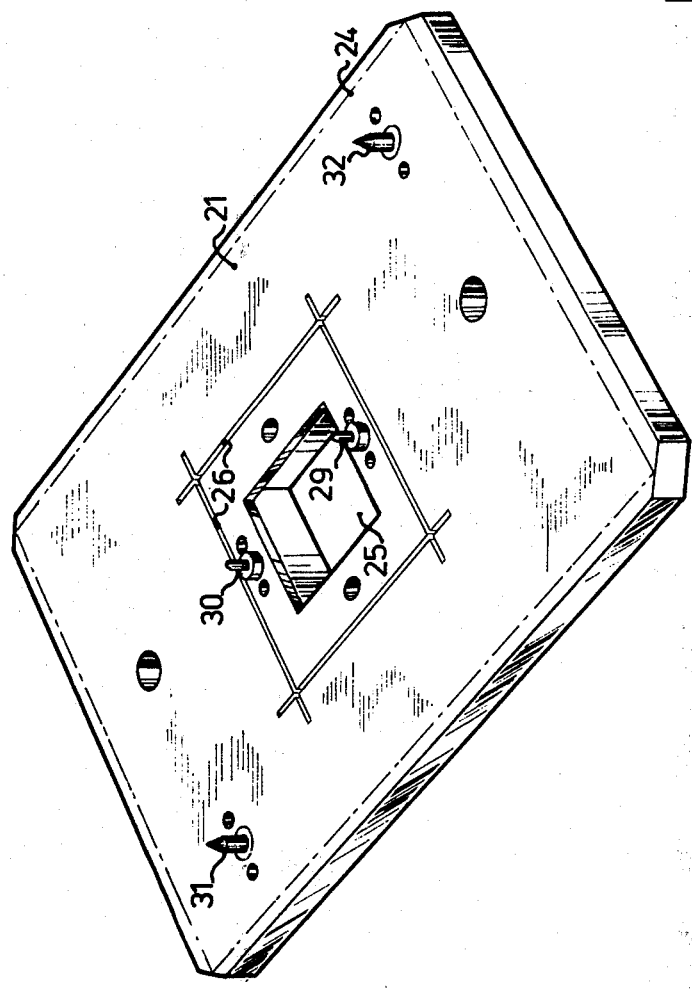
FIG. 3, a perspective view of the first support of the positioning arrangement used in the apparatus in FIG. 1

As can be seen in FIGS. 1 and 2, the positioning arrangement 14 incorporates a first support plate 17 the upper face of which is used as a sliding surface for the strip 10. This support plate 17, which is secured to the framework of the apparatus, is provided with two holes in which two support rods 18 and 19 are free to slide. At the lower end each of the support rods is attached to a tie-bar 20 which extends below support place 17. The upper end of each support rod is threaded to allow a second support plate 21 (FIG. 1) to be mounted on the rods parallel to support plate 17. Plate 21 is held in position on rods 18 and 19 by two knurled nuts 22 and 23. In FIG. 3, support plate 21 is shown inverted in order to display the members which ensure that the strip is accurately positioned in relation to a transparency which is set up on this support plate. In FIG. 3 the transparency has been deliberately omitted in order that certain details of the support plate 21 may be better shown. Nevertheless, the outline of the transparency is shown in the Figure by a broken line marked 24.

FIG. 3 shows suppot plate 21 to be provided with an opening 25 through which pass the light rays which are used to expose the photo-sensitive lacquer on the strip through the transparency which has previously been positioned over this opening. Channels 26, which are cut into support plate 21 around opening 25, communicate, via a nozzle 28, with a vacuum apparatus which is not shown. Thus, it is possible for the transparency to be held against support plate 21 by suction. In the example described, the exact positioning of the transparency on plate 21 is ensured in a known way by means of alignment holes formed in the transparency into which, when the transparency is applied against plae 21, fit two locating pins 31 and 32 attached to the plate. It should however be mentioned that the means for positioning and holding the transparency on support plate 21 which have just been described do not limit the invention and could be replaced by equivalent means.

The tie-bar 20 seen in FIG. 2 is normally coupled to an actuating mechanism (not shown) which allows the assembly formed by tie-bar 20 and support rods 18 and 19 to be raised or lowered. It can thus be seen that, when, as shown in FIG. 1, support plate 21 is fastened to rods 18 and 19, it is able to be moved between two positions, namely a first position in which plate 21 is held at a distance from support plate 17 and a second position in which the transparency which has previously been applied to plate 21 is in contact with strip 10.

FIG. 3 shows that plate 21 is provided with two studs 29 and 30 which are used to align one of the openings in the strip exactly with the transparency when the opening has arrived beneath the transparency as a result of the strip being moved forward by the feed device 15. This alignment operation is performed by making use of certain of the lateral perforations in the strip. To this end it should be mentioned that the pitch of the central opening FC which, as can be seen in FIG. 2 are arranged in a line along the central axis M of the strip, is a whole-number multiple of the pitch of the lateral perforations in each of the two rows of perforations in the strip. Thus, in the case of the strip shown in FIG. 2, the pitch of the central openings is four times that of the lateral perforations. Each of these central openings has two axes of symmetry, one of which is the central axis M of the strip 10 and the other of which, which bears a reference A1, A2, A3, An, etc . . . , is perpendicular to axis M. The two perforations situated at right angles to the centre of each opening are in line along the axis of symmetry A of this opening. These perforations are used solely to position strip 10 accurately, whereas the step-by-step advance of the strip is produced by two claws 40 and 41 associated with the feed device 15 which engage in other perforations in the strip.

Figure 7:
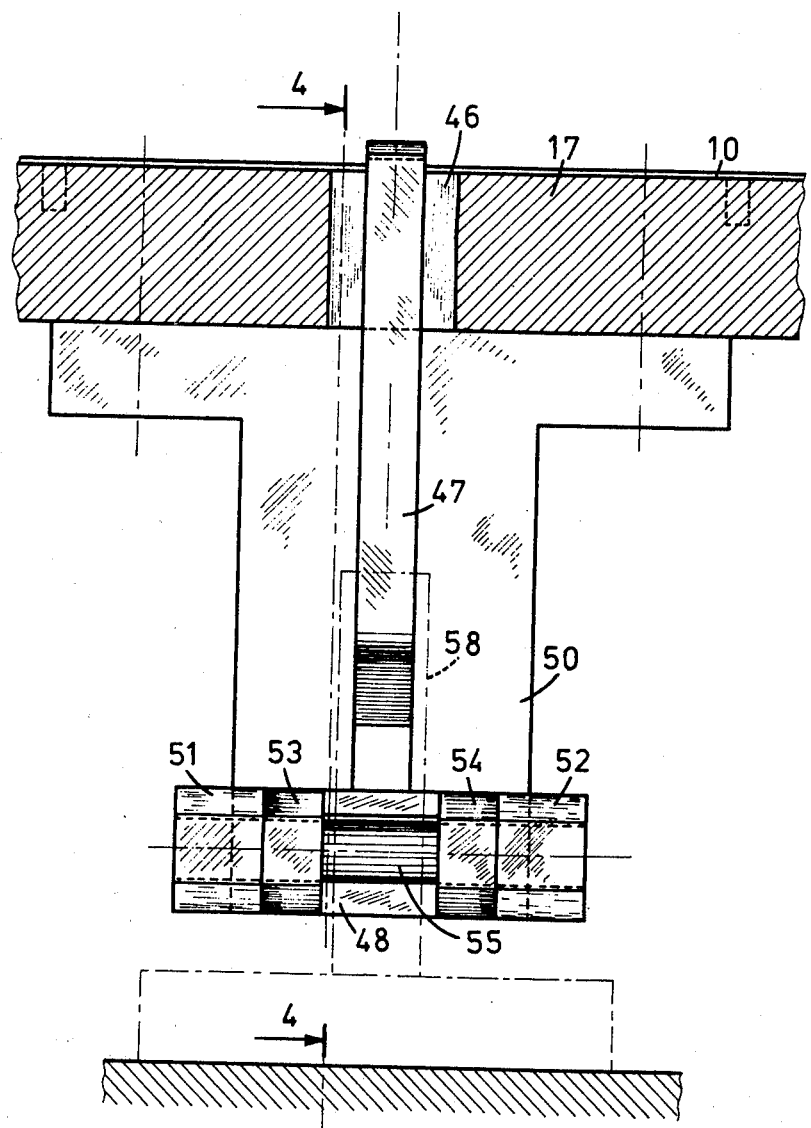

There will now be described, with reference to FIGS. 2, 4 and 7, the members which, in accordance with the invention, are responsible for accurately positioning strip 10. For this purpose, support plate 17 contains two holes, of which the one marked 42 can be seen in FIG. 2, these holes being intended to accept the studs 29 and 30 on support plate 21 when, as a result of this plate 21 being lowered, these studs engage in the perforations which are used to position the strip accurately. FIG. 2 also shows two intercepting arms 43 and 44 the function of which will be explained below, these two arms passing through respective ones of two openings 45 and 46 made in support plate 17. Since these arms are identical, details will only be given in what follows of intercepting arm 44.

Figure 4:
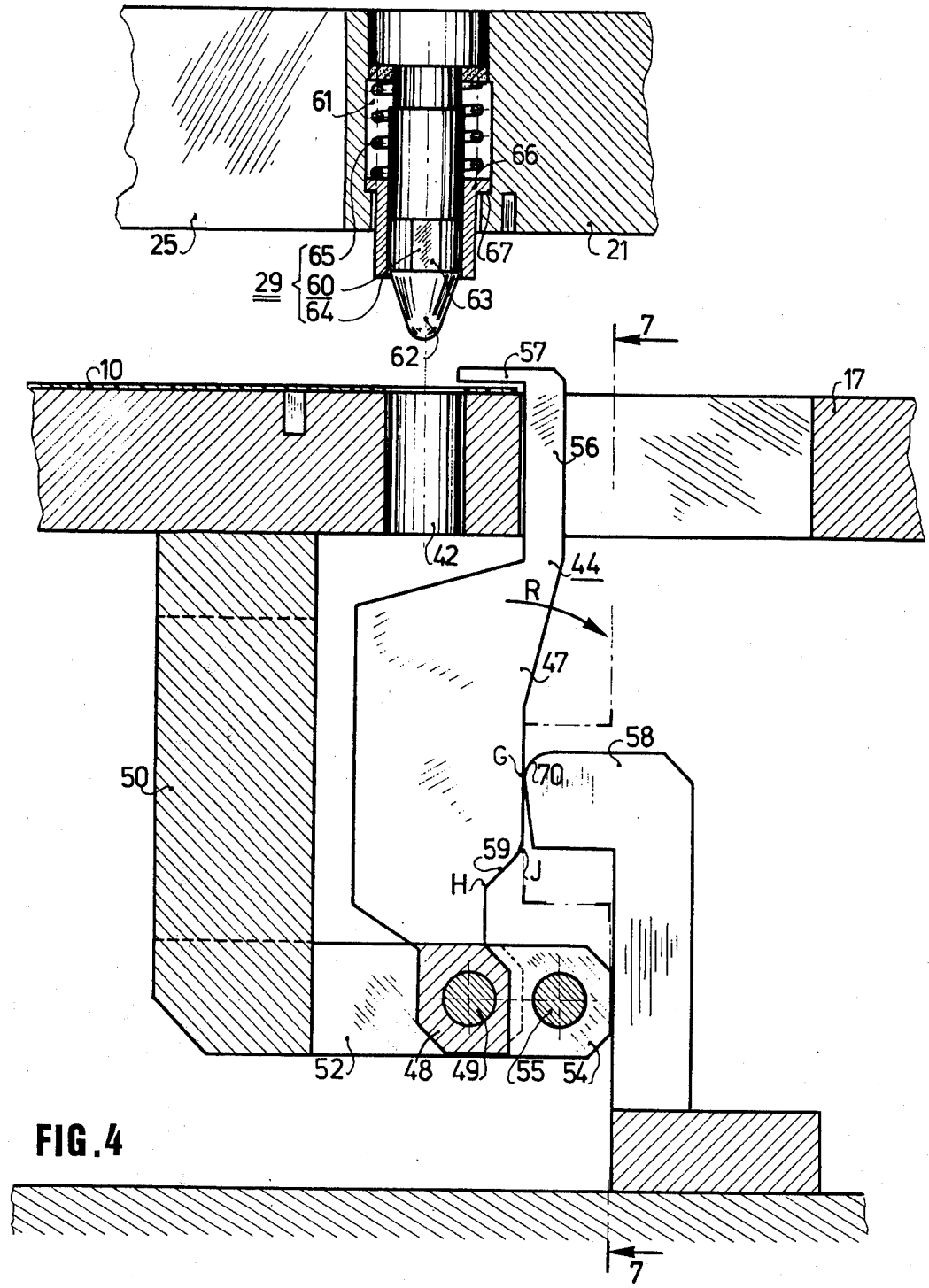
FIGS. 4 to 6, cross-sectional views, along a line marked A—A in FIG. 2, showing different positions of component parts of a positioning arrangement designed in accordance with the invention, and FIG. 7, a view of the intercepting mechanism, in cross section along a line marked 7—7 in FIG. 4.

FIG. 4 is a cross-sectional view, along a line marked A—A in FIG. 2 of part of support plate 17 and part of support plate 21, which latter is assumed to be fastened to support rods 18 and 19. The figure shows that intercepting arm 44 consists of a substantial body 47 which is generally in the form of a small plate and which is attached at the bottom to a sleeve 48 which pivots around a fixed horizontal shaft 49. This shaft 49 is held in position by a bracket 50 which is attached underneath suppot plate 17 and ends in a fork whose arms 51 and 52 (FIGS. 4 and 7) support shaft 49. The body 47 is machined so that its upper part forms a slender portion 56 which passes through the opening 46 in support plate 17 and which extends into an intercepting tongue 57 which will be described below. Sleeve 48 carries two horizontal arms 53 and 54 which are used to support a shaft 55 arranged parallel to shaft 49. FIGS. 4 and 7 also show that intercepting arm 44, which is able to pivot about shaft 49 in the direction indicated by arrow R in FIG. 4, is normally locked in a so-called intercepting position by a locking foot 70 which is formed at the end of a stop 58 which is itself attached to the tie-bar 20 mentioned above. In this way, stop 58 is secured to support plate 21 via tie-bar 20 and support rods 18 and 19, and is thus able to be moved in the direction in which bar 20 and plate 21 move, i.e. perpendicularly to support plate 17. FIG. 4 shows that the body 47 is provided, on its right-hand edge, with a smoothly polished area which forms a sliding surface 59 for foot 70, this area extending between two points which are marked G and H in FIG. 4, G being the point at which foot 70 is in contact with surface 59 when plate 21 is in its first position. FIG. 4 shows that there are two parts to the sliding surface 59, namely a part GJ which is parallel to the direction of movement of the stop and over which foot 70 slides at the beginning of its downward movement, and a part JH the direction of which diverges from this direction of movement. The centre of gravity of arm 44 is such that, when foot 70 clears part GJ as it descends, arm 44 remains in the intercepting position. However, as can be seen in FIG. 4, shaft 55 lies on the path which is followed by stop 58 when it moves. Under these circumstances, when the stop moves down, shaft 55 is eventually struck by the stop and, being pushed by it, causes arm 44 to turn about its pivot shaft 49.

There will now be described the construction of the studs 29 and 30 which are used to position strip 10 accurately on support plate 17. As can be seen in FIG. 4, stud 29 is made up of a plurality of parts one of which is formed by a peg 60 which is secured in a seating 61 in support plate 21. This peg has a tapering end 62, which is intended to make it easier for the said peg to engage in one of the perforations in the stip, and a working portion 63 the corss-section of which corresponds to the shape of these perforations so that it will fit closely into the perforation in which end 62 has been engaged. FIG. 4 shows that this working portion 63 projects from the lower face of support plate 21 but that it is normally masked by a sleeve 64 which forms part of stud 29 and is able to slide over peg 60. This sleeve 64, which is urged forward by a coil spring 65 mounted in seating 61, has a rim 66 which, under the action of spring 65, presses against a shoulder 67 in the seating and thus prevents sleeve 64 from escaping. The size of the hole 42 in support plate 17 which is intended to accept stud 29 is such that it allows peg 60 to fit easily into it when support plate 21 is moved to its second position whilst at the same time preventing the entry of sleeve 64.

The construction of stud 30 is similar to that of stud 29 and the peg which it contains has a cross-sectional shape which allows it to fit closely into the perforations in the strip.

As can be seen from FIGS. 2 and 4, the shape of the end of the intercepting tongue 57 on intercepting arm 44 is such that, assuming arm 44 to be held in the intercepting position as shown in FIG. 4, it is situated on the path which sleeve 64 follows when plate 21 moves from its first to its second position, but is clear of the path followed by peg 60 in the course of this same movement.

Figure 5:
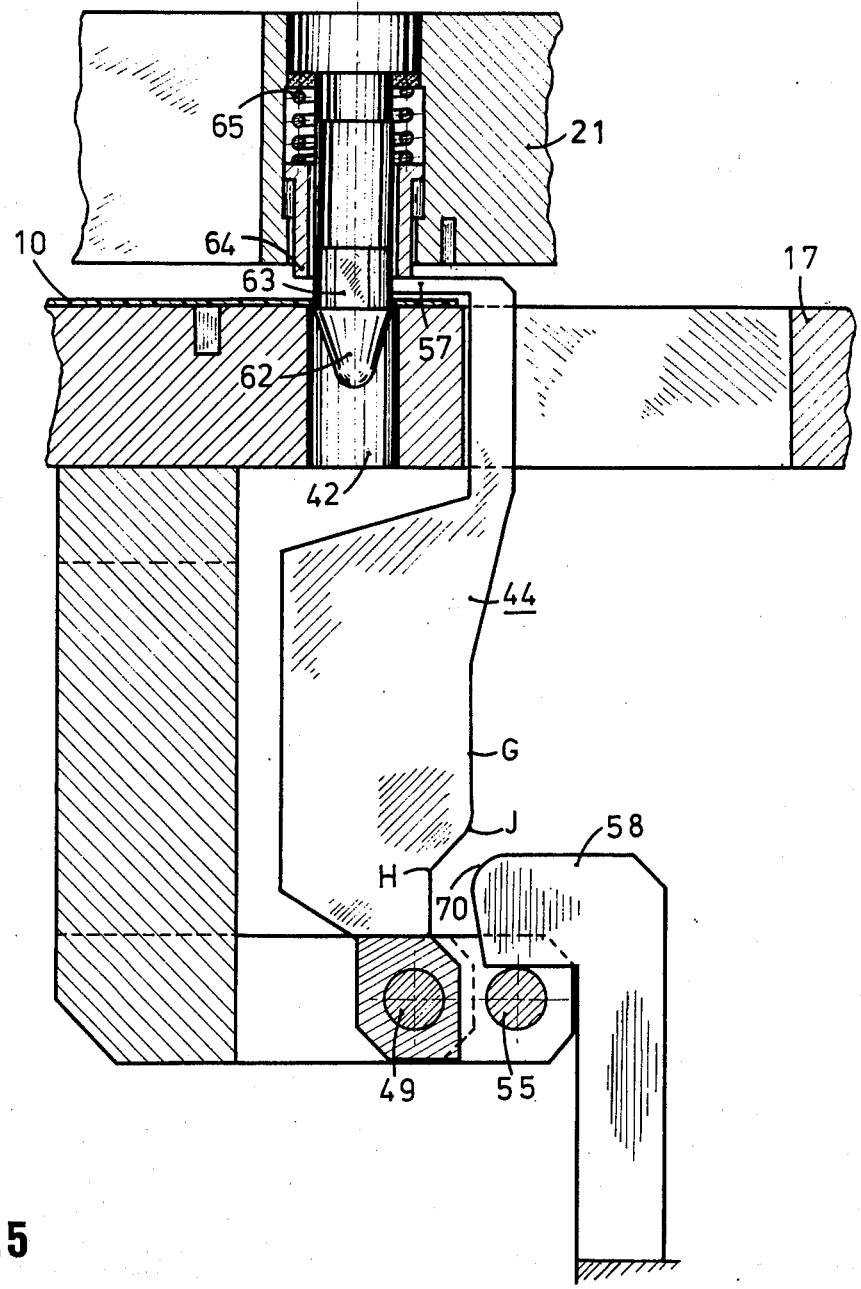
Figure 6:
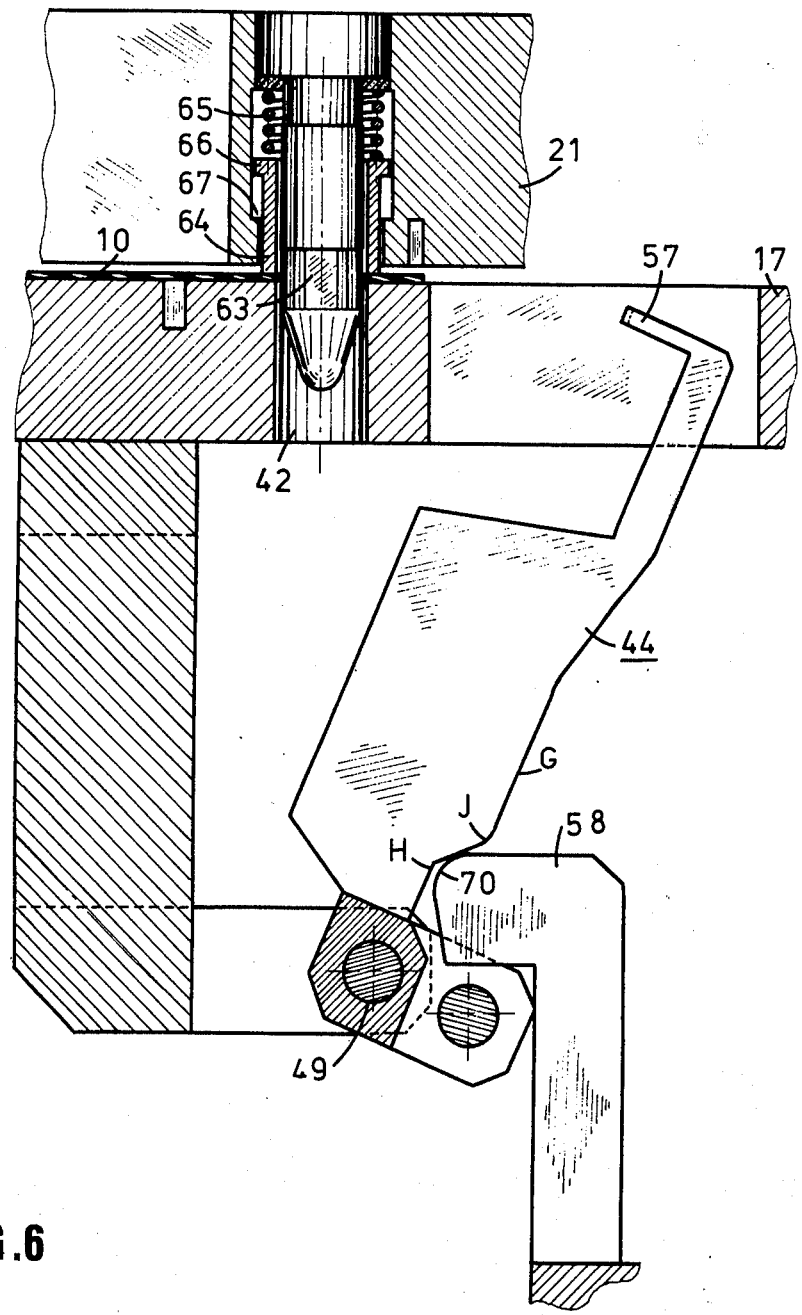

The operation of the mechanism just described will now be explained with reference to FIGS. 4, 5 and 6.

For this purpose, it will be assumed that, support plate 21 being in its first position, i.e. remote from support plate 17, strip 10 has been fed forward by feed device 15 so that one of the openings in the strip is substantially in the exposure position. By substantially is meant that the two lateral perforations in the strip which lie in line with the axis of symmetry A of this opening are situated below studs 29 and 30 but are not exactly positioned in relation to the studs. If the assembly formed by tie-bar 20, stop 58, support rods 18 and 19 and support plate 21 is then lowered, the tapering end 62 of peg 60 enters the perforation in the strip which is situated over hole 42 and engages in the hole, whilst the locking foot 70, sliding over the sliding surface 39 on body 47 eventually clears this surface at point J. As the downward movement continues, sleeve 64 is soon stopped by intercepting tongue 57 and thus allows the working portion 63 of peg 60 to become exposed in the course of the downward movement so that, as shown in FIG. 5, it can insert itself closely in the perforation situated over hole 42. At this moment, strip 10 is exactly positioned in relation to the two pegs of studs 29 and 30, remembering that, when the tapering ends of the said pegs engage in the perforations, the ribbon can be moved slightly by these ends, if need be, before the working portions of the pegs engage in the perforations. It should also be noted that when sleeve 64 is arrested while plate 21 continues to descend it has the effect of compressing spring 65. As the downward movement continues, stop 58 strikes against shaft 55 at the moment when the working portion 63, of peg 60 has already begun to engage in the perforation situated above hole 42. From this moment, stop 58, continuing to move down draws shaft 55 downwards and thus compels arm 44, to turn in the direction of arrow R. Tongue 57, moving away from its intercepting position, then releases sleeve 64 which, under the action of spring 65, comes down onto strip 10 as shown in FIG. 6 and thus holds it pressed against support plate 17. Arm 44 then tips fully under its own weight but during the tipping movement it is restrained by stop 58, foot 70 then making contact with sliding surface 59 on arm 44 at a point situated along the part JH of this surface. The assembly formed by tie-bar 20, stop 58, support rods 18 and 19 and support plate 21 continues downward until the transparency which is held against plate 21 makes contact with strip 10. At this moment the downward movement of the assembly is halted and strip 10 is exposed through the transparency. When this operation has been completed, the assembly is raised again to return support-plate 21 to its original position. In the course of this movement peg 60 gradually emerges from hole 43. Sleeve 64, under the action of spring 65, continues to hold strip 10 pressed against plate 17 and thus allows the working portion 63 of peg 60 to extract itself from the perforation into which it has been inserted. When the rim 66 on the sleeve again comes up against shoulder 67, i.e. when the working portion 63 of the peg is entirely clear of the perforation, the strip ceases to be held down. From this point on sleeve 64 is moved by support plate 21 and rises with it. It can be seen that, in the course of the upward movement of plate 21, stop 58 rises also, the foot 70 pushing arm 44 gradually back to return it to the intercepting position. This movement is accompanied by a shift toward point J of the point of contact between arm 44 and foot 70. However, arm 44 returns to the intercepting position only well after sleeve 64, carried along by plate 21, has moved clear of the path followed by the tongue 57 on the arm. Thus, there is no danger when the tongue returns to the intercepting position of it hooking on sleeve 64. When arm 44 has returned to the intercepting position, the assembly formed by bar 20, stop 58, support rods 18 and 19 and support plate 21 continues to rise and during this movement foot 70 continues to slide over portion JG of the sliding surface on the arm. This upward movement continues until support plate 21 has returned to its first position. At this moment the upward movement of the assembly is halted and, peg 60 having been disengaged by means of sleeve 64 from the perforation in which it was engaged, strip 10 may be moved forward by the feed device 15 to bring another opening in the strip into the exposure position.

Thus, by repeating the operations just described it is possible, by exposing the photo-sensitive lacquer covering the strip, to produce on the strip a series of images which are accurately positioned in relation to the lateral perforations in the strip. In this connection, it has been found that, using the positioning arrangement according to the invention, the positional errors between the images obtained and the perforations in the strip were extremely small, of the order of 7 to 10 microns. Further-more, these images, which are all obtained from the same transparency, are absolutely identical no matter how long the strip may be.

What is claimed is:
1. An apparatus for positioning a flexible strip with respect to an image, said flexible strip including at least one series of lateral perforations having a perforation cross-section, comprising in combination:
   a first support having at least one opening therethrough, said opening having an opening cross-section, said first support defining a sliding surface for said flexible strip;
   a second support having a first position at a predetermined distance from said first support and a second position in close proximity with said first support, said image being fixedly secured to said second support and in contact with said flexible strip in said second position;
   means for moving said second support between said first and second positions;
   at least one stud member secured to said second support member is substantial alignment with said opening of said first support, said stud member including a working section having a working cross-section, a sleeve slidably engaging said working section and movably operable between a first sleeve position substantially encasing said working section and a second sleeve position disclosing said working section, and means for biasing said sleeve towards said first sleeve position;
   at least one intercepting arm pivotally secured to said first support and operable between a first arm position and a second arm position, said intercepting arm interferingly engaging said sleeve in said first arm position as said second support is moved from said first position to said second position, whereby said sleeve is urged towards said second sleeve position; and
   means for rotating said intercepting arm from said first arm position to said second arm position in response to movement of said second support towards said second position, whereby said sleeve is released to positionally maintain said flexible strip with respect to said image;

said working section of said stud substantially engaging said one of said lateral perforations prior to release of said sleeve to substantially align said flexible strip with respect to said image.

2. An apparatus as claimed in claim 1 wherein said opening cross-section and said working cross-section substantially correspond, whereby said biasing means urges said sleeve against said first support upon release of said sleeve by said intercepting arm.

3. An apparatus as claimed in claim 1 wherein said stud member further includes a tapered end section to facilitate engagement of said stud member with said one of said lateral perforations.

4. An apparatus as claimed in claim 1 wherein said rotating means includes a stop member relatively secured to said second support member and movable therewith.

5. An apparatus as claimed in claim 4 wherein said stop member defines means for returning said intercepting arm to said first arm position as said second support is moved from said second position to said first position, said return means initiating return as said working section substantially disengages said one of said lateral perforations.

6. An apparatus as claimed in claim 4 wherein said stop member initiates rotation of said intercepting arm as said working section substantially engages said one of said lateral perforations.

7. An apparatus as claimed in claim 1 wherein said second support is a plate member having a seating adapted to receive said stud member.

8. An apparatus as claimed in claim 7 wherein said seating defines a shoulder adapted to retain said sleeve therein.

9. An apparatus as claimed in claim 8 wherein said sleeve engages said collar in said first sleeve position.

10. An apparatus as claimed in claim 8 wherein said biasing means includes a spring mounted within said seating and adapted to urge said sleeve against said shoulder of said seating.

11. An apparatus as claimed in claim 1 wherein said flexible strip includes two series of lateral perforations along each edge thereof.

12. An apparatus as claimed in claim 11 wherein said first support includes two openings, therethrough substantially aligned with said two series of lateral perforations, respectively.

13. An apparatus as claimed in claim 12 including two stud members substantially aligned with said two openings of said first support member.

* * * * *